US007686434B2

(12) United States Patent
Hiroshima

(10) Patent No.: US 7,686,434 B2
(45) Date of Patent: Mar. 30, 2010

(54) INKJET RECORDING SYSTEM

(75) Inventor: Susumu Hiroshima, Osaka (JP)

(73) Assignee: Kyocera Mita Corporation, Osaka (JP)

( * ) Notice: Subject to any disclaimer, the term of this patent is extended or adjusted under 35 U.S.C. 154(b) by 180 days.

(21) Appl. No.: 11/976,018

(22) Filed: Oct. 19, 2007

(65) Prior Publication Data

US 2009/0051740 A1 Feb. 26, 2009

(30) Foreign Application Priority Data

Oct. 20, 2006 (JP) ............................ 2006-286206
Oct. 20, 2006 (JP) ............................ 2006-286207

(51) Int. Cl.
*B41J 2/045* (2006.01)
*H01L 41/00* (2006.01)
*H02N 2/00* (2006.01)

(52) U.S. Cl. ........................................ 347/72; 310/311

(58) Field of Classification Search .................. 347/69, 347/72
See application file for complete search history.

(56) References Cited

FOREIGN PATENT DOCUMENTS

JP 2004-114308 4/2004

*Primary Examiner*—Matthew Luu
*Assistant Examiner*—Lisa M Solomon
(74) *Attorney, Agent, or Firm*—Clark & Brody

(57) ABSTRACT

An inkjet recording system including an inkjet recording head in which a part of wall face of a pressure chamber in which a nozzle is provided is formed of a piezoelectric element, the piezoelectric element being activated and deformed to make pressure wave act on ink in the pressure chamber, thereby discharging an ink droplet from the nozzle, wherein surface of the piezoelectric element forming a part of wall face of the pressure chamber has a centerline average roughness Ra ranging from 0.05 to 2 μm, and contact angle θ with ink is 45 degrees or less, and the following expression (1) is satisfied;

$$A \cos^2 \theta > 0.04 \quad (1)$$

wherein A represents centerline average roughness Ra (μm) of surface of piezoelectric element forming wall surface of pressure chamber, and θ represents contact angle of ink with respect to piezoelectric element.

10 Claims, 5 Drawing Sheets

INKJET RECORDING SYSTEM

BACKGROUND OF THE INVENTION

1. Field of the Invention

The present invention relates to inkjet recording systems and recording apparatuses having excellent ink chargeability.

2. Description of Related Art

Recent outstanding improvement in inkjet recording technique has enabled production of high-definition images which are very similar to photographs. Consequently, inkjet recording has been widely used in various fields of art. In association with this, there is a need of improving printing speed as well as obtaining high-definition images. As a measure for improving printing speed, there is known a method of increasing the number of nozzles, and discharging ink droplet in larger amount per unit time from each head. In such a measure, driving frequency of 15 kHz or higher is desired, and it is necessary to supply ink that is to be used in unit time by every head without any excess and deficiency from an ink cartridge.

However, in an inkjet head, when wettability of ink flow channel provided in the head is poor, bubbles may occur in the ink flow channel during charging of ink. Furthermore, these bubbles can solidly adhere to the wall face of the flow channel, and will not be discharged easily even if discharging operation by suction of ink is conducted. When bubbles remain in the ink flow channel, troubles such as dot missing and printing disorder, as well as jet impossibility occur, to deteriorate the printing quality.

In order to improve the wettability of a head constituting member made of a resin material, Japanese Patent No. 3454514 publication proposes techniques of imparting hydrophilicity by acid treatment or plasma treatment, or of containing a filler imparted with hydrophilicity by acid treatment. However, in the structure disclosed in the patent document in which ink directly contacts piezoelectric elements, piezoelectric elements may get corroded or deteriorated by hydrophilizing treatment.

On the other hand, Japanese Patent Application Laid-Open Publication No. 2004-114308 proposes a method of forming each layer by burning in a laminate-type piezoelectric element so as to increase the toughness and strength of the piezoelectric element. Since the piezoelectric element disclosed in the patent document is a burnt member of ceramics or the like, its surface has fine bumpy structure, so that ink is difficult to be charged. When bubbles remain on the surface of the piezoelectric element that generates pressure due to failure in charging of ink, the generated pressure will not travel satisfactorily, so that discharge defects such as ink flight curve, decrease in discharging speed, or discharge failure will occur.

Moreover, inventor's detailed examination of the process in which ink is charged revealed that charging ratio increases with the lapse of time, or in other words, some time is required from charging for achieving stabilization. Here, the term charging ratio means a ratio of number of nozzles capable of printing, relative to the total number of nozzles of the inkjet recording head.

SUMMARY OF THE INVENTION

It is an object of the present invention to provide an inkjet recording system and a recording apparatus of high reliability in which ink chargeability is improved.

It is another object of the present invention to provide an inkjet recording system and a recording apparatus in which charging ratio is rapidly increased.

Inventors of the present invention made diligent efforts for achieving the above objects. As a result, inventors found the new fact that an inkjet recording system of high reliability in which speed of charging ink into the inkjet recording head is improved and no discharge-defective nozzle occurs is realized, when centerline average roughness of surface of piezoelectric element forming wall face of pressure chamber, and contact angle between the piezoelectric element and ink fall within predetermined ranges, and a value calculated from a relational expression between centerline average roughness of the piezoelectric element and contact angle is larger than a predetermined value.

That is, an inkjet recording system of the present invention includes an inkjet recording head in which a part of wall face of a pressure chamber in which a nozzle is provided is formed of a piezoelectric element, and the piezoelectric element is activated and deformed to make pressure wave act on ink in the pressure chamber, thereby discharging an ink droplet from the nozzle. At this time, in the present invention, surface of the piezoelectric element forming a part of wall face of the pressure chamber has a centerline average roughness Ra ranging from 0.05 to 2 μm, and contact angle θ with ink is 45 degrees or less, and the following expression (1) is satisfied;

$$A\cos^2\theta > 0.04 \tag{1}$$

wherein A represents the aforementioned centerline average roughness Ra (μm), and θ represents contact angle of ink with respect to piezoelectric element.

Therefore, according to the present invention, since ink is rapidly charged into the inkjet recording head, no discharge-defective nozzle will occur, and the reliability of the inkjet recording head is improved.

Furthermore, the present inventors found the new fact that when average inclination Δa of piezoelectric element and contact angle between the piezoelectric element and ink fall within predetermined ranges, and a value calculated from a relational expression between average inclination of the piezoelectric element and contact angle is larger than a predetermined value, it is possible to realize an inkjet recording system in which the speed of discharging ink into the inkjet recording head is improved, and charging ratio is rapidly improved.

That is, an inkjet recording system of the present invention includes an inkjet recording head in which a part of wall face of a pressure chamber in which a nozzle is provided is formed of a piezoelectric element, and the piezoelectric element is activated and deformed to make pressure wave act on ink in the pressure chamber, thereby discharging an ink droplet from the nozzle. At this time, in the present invention, surface of the piezoelectric element forming a part of wall face of the pressure chamber has an average inclination Δa of 100 to 1000 mrad, and contact angle θ with ink is 45 degrees or less, and the following expression (2) is satisfied;

$$\cos\theta \times \cos(\Delta a) > 0.5 \tag{2}$$

wherein Δa represents the aforementioned average inclination (rad), and θ represents contact angle of ink with respect to piezoelectric element.

In this manner, according to the present invention, it is possible to improve the speed of charging ink into an inkjet recording head, and to rapidly improve the charging ratio.

A recording apparatus of the present invention uses an inkjet recording system in which two or more recording heads each having 500 or more nozzles, are arranged in the horizontal direction which is perpendicular to a conveying direction of recording medium.

Other objects and advantages of the present invention will be made clear from the following description.

DETAILED DESCRIPTION OF THE PREFERRED EMBODIMENTS

Figure 1:
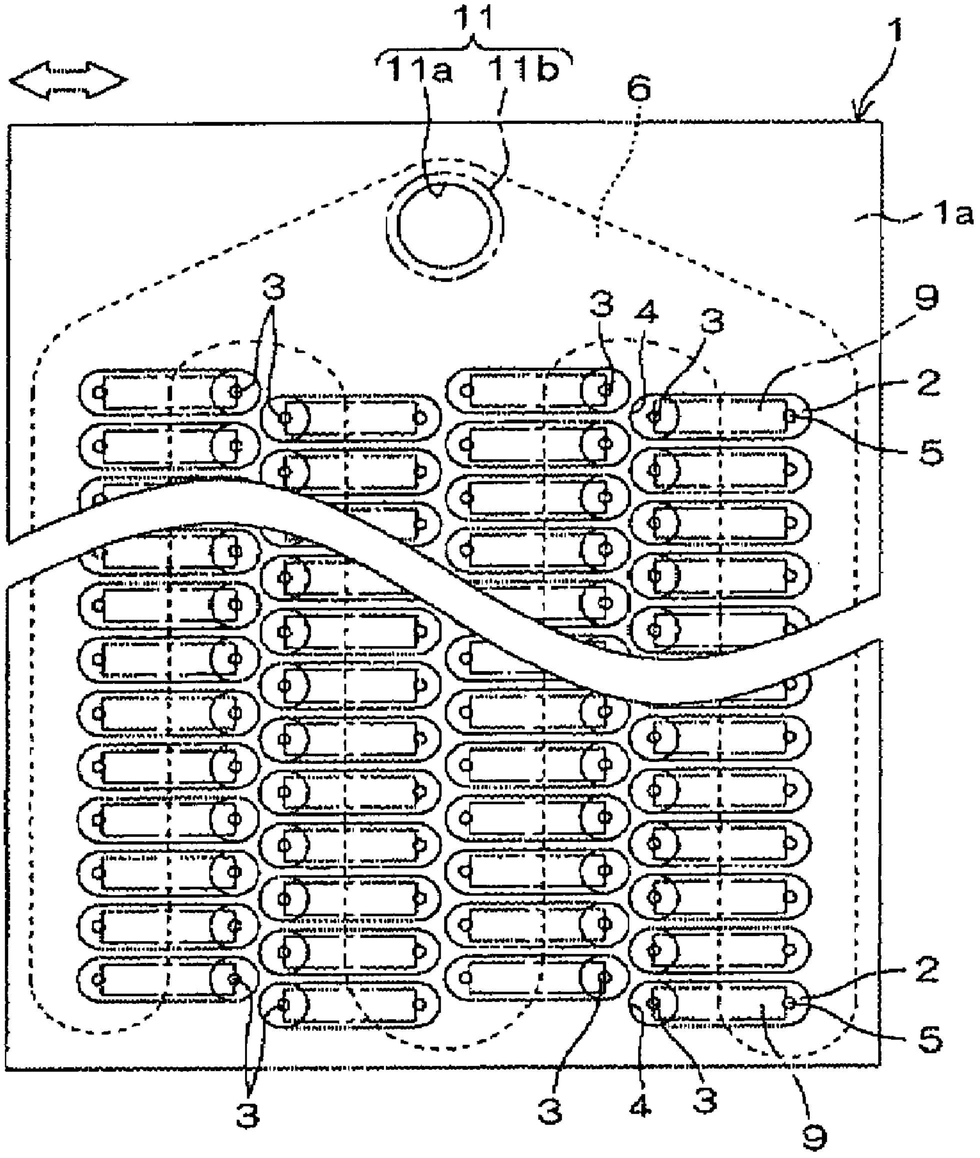
FIG. 1 is a plan view showing a piezoelectric inkjet recording head according to one embodiment of the present invention.

In the following, an inkjet recording head and a recording system according to the present invention will be explained in detail.

First Embodiment

In an inkjet recording head in the present embodiment, a part of wall face of a pressure chamber in which a nozzle is provided is formed of a piezoelectric element, and the piezoelectric element is activated and deformed to make pressure wave act on ink in the pressure chamber, thereby discharging an ink droplet from the nozzle. Surface of the piezoelectric element forming a part of wall face of the pressure chamber has a centerline average roughness Ra ranging from 0.05 to 2 μm, and contact angle θ with ink is 45 degrees or less, and the above expression (1) is satisfied. Preferably, the contact angle is from 5 to 45 degrees.

According to the present invention, it was found that ink chargeability for an inkjet recording head has relationship with centerline average roughness of surface of piezoelectric element that directly contacts the ink and causes generation of pressure wave. That is, when centerline average roughness Ra of piezoelectric element is smaller than 0.05 μm, ink fails to enter the fine and deep structure of surface of the piezoelectric element, so that air remains as fine bubbles on the surface of the piezoelectric element. This would cause decrease in charging ratio. When centerline average roughness Ra is larger than 2 μm, the time required for the ink to achieve a desired charging ratio is extended. This is attributable to the fact that a longer time is required for the ink to enter bumpy structure in the surface of the piezoelectric element when the centerline average roughness is large. Within the range of the present invention, the time required for achieving a desired charging ratio is reduced. Here, the term charging ratio means ratio of nozzle number in which printing is succeeded, relative to the total nozzle number possessed by the inkjet recording head.

It was also found that ink chargeability has a relationship with contact angle between piezoelectric element and ink. Specifically, when the contact angle exceeds 45 degrees, a time required for the ink to achieve a desired charging ratio is extended. On the other hand, at a contact angle of less than 45 degrees, the smaller the angle, the longer the time required for increasing the charging ratio. When contact angle is very small, wettability against nozzle surface is high, which may decrease the charging ratio is. Therefore, 5 to 45 degrees is preferred.

As to ink chargeability, when the centerline average roughness A of the piezoelectric element and the contact angle θ satisfy the above expression (1), charging ratio is rapidly increased. When it is outside the range of expression (1), some time is required to increase the charging ratio. Since A has a relation to an area of wetting by ink, and cos θ has a relation to wetting work of ink, the above expression (1) is referable to as an experimental expression concerning charging of surface of piezoelectric element with ink.

Figure 4:
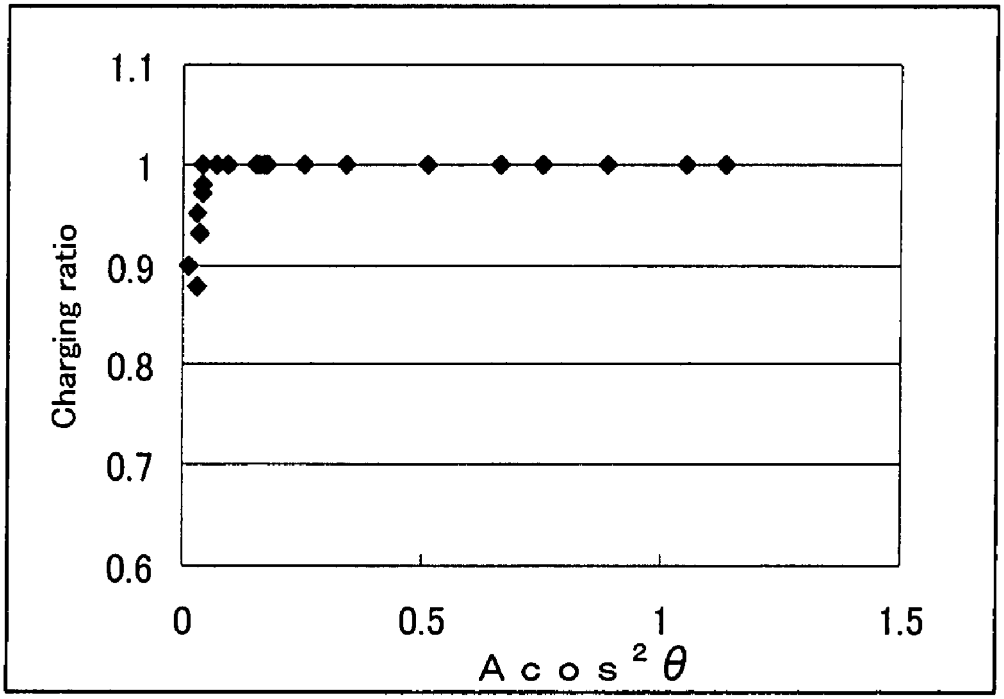
FIG. 4 is a graph showing the relationship between value of A $\cos^2\theta$ and charging ratio of ink in the present invention.

Here, the relationship between the above expression (1) and ink charging ratio will be explained with the use of FIG. 4. In FIG. 4, the horizontal axis represents calculated value of expression (1) and the vertical axis represents charging ratio. Contact angle of ink is 45 degrees. As shown in FIG. 4, when value of expression is so small as around zero, charging ratio is lower than 0.9. Contrarily, as the value of expression (1) increases, charging ratio increases, and as can be seen in FIG. 4, charging ratio stabilizes at 1 when expression (1) is higher than 0.04. Therefore, value of expression (1) should be larger than 0.04.

(Ink)

The ink in the present invention consists at least of water, a coloring agent, a water-soluble organic solvent and a surfactant, and may be added with a pH modifier, an antiseptic and antifungal agent and so on as is necessary. The surfactant realizes desired surface tension of ink by adjustment of its adding amount, and as a result, the contact angle with the piezoelectric element can be adjusted to a desired contact angle.

As a coloring agent, any of dyes such as direct dyes, acidic dyes and basic dyes, and pigments may be used. In the present invention, pigments are preferably used from the view points of water resistance and light resistance.

Examples of component of pigment include coloring pigment components including organic pigments such as insoluble azo pigment, soluble azo pigment, phthalocyanine blue, isoindolinone, quinacridone, dioxadine violet, berinone, betarine and the like, and inorganic pigments such as carbon black, titanium dioxide and so like; and extender pigments such as white clay, talc, clay, diatomaceous earth, calcium carbonate, barium sulfate, titanium oxide, alumina white, silica, kaolin, aluminum hydroxide and the like.

Concrete examples of organic pigment will be recited below. For instance, as magenta pigments, C.I. pigment red 2, C.I. pigment red 3, C.I. pigment red 5, C.I. pigment red 6, C.I. pigment red 7, C.I. pigment red 15, C.I. pigment red 16, C.I. pigment red 48:1, C.I. pigment red 53:1, C.I. pigment red 57:1, C.I. pigment red 122, C.I. pigment red 123, C.I. pigment red 139, C.I. pigment red 144, C.I. pigment red 149, C.I. pigment red 166, C.I. pigment red 166, C.I. pigment red 177, C.I. pigment red 178, and C.I. pigment red 222 can be recited.

In an inkjet recording method, recently, color images are formed, for example, using six colors including orange and green in addition to the base colors, yellow, magenta, cyan and black, or using eight colors including light magenta and light blue in addition to the above six colors.

To obtain these color phases, those having excellent weather resistance are preferred, and particularly preferred are C.I. pigment yellow 138, 154, 180, 185 for yellow, C.I.

pigment red 122, 202, C.I. pigment violet 19 for magenta, C.I. pigment blue 15 for cyan, C.I. solvent black 3, and particularly acidic or neutral pigments of C.I. pigment black 7 for black, C.I. pigment orange 43, 64, 71 for orange, and C.I. pigment green 7, 36 for green.

The content of pigment in the total amount of ink is preferably 1 to 10% by mass, and more preferably 3 to 7% by mass.

For dispersing pigment in ink solvent, water-soluble resin may be used. Examples of such water-soluble resin include styrene-acryl-acrylate alkyl ester copolymer, styrene-acrylate copolymer, styrene-maleate copolymer, styrene-maleate-acrylate alkyl ester copolymer, styrene-methacrylate copolymer, styrene-methacrylate alkyl ester copolymer, styrene-maleate half ester copolymer, vinylnaphthalene-acrylate copolymer, vinylnaphthalene-maleate copolymer and so on.

The content of water-soluble resin in the total amount of ink is preferably 0.1 to 10% by mass, and more preferably 1 to 5% by mass. These water-soluble resins may be used in combination of two or more kinds.

For dispersing the pigment, a ball mill, sand mill, roll mill, agitator, sonic homogenizer, wet jet mill, paint shaker or the like may be used. The obtained pigment dispersion is preferably subjected to centrifugation by a centrifuge or filtration by a filter so as to remove contaminants, dusts, coarse particles occurring in the process of dispersion.

An average particle diameter of pigment particles for use is 30 to 300 nm, and preferably 50 to 150 nm. Average particle diameter may be measured by using a dynamic light scattering particle size meter (available from HORIBA, LB-550).

As a surfactant used in ink, preferably used are, but are not limited to, polyoxyethylene alkyl ethers, polyoxyethylene alkyl allyl ethers, acetylene glycols, polyoxyethylene-polyoxypropylene block copolymers and the like nonionic surfactants.

Examples of the water-soluble organic solvents in the present invention include ethyleneglycol monobutyl ether, triethyleneglycol monomethyl ether, diethyleneglycol monomethyl ether, ethylene glycol monomethylether, triethyleneglycol, hexyleneglycol, octanediol, thiodiglycol, 2-butyl-2-ethyl-1,3-propanediol, 3-methyl-1,5-pentanediol, 2-ethyl-2-methyl-1,3-propanediol, 2,4-pentanediol, 1,5-pentanediol, 2,2-dimethyl-1,3-propanediol trimethylpropane, 2-methyl-1,3-propanediol, diethylene glycol, propylene glycol, butanediol, ethylene glycol, glycerin, 2-pyrrolidone and the like.

(Inkjet Recording Head)

One example of an inkjet recording head in the present invention will be shown in FIG. 1. FIG. 1 shows the state before attaching a piezoelectric actuator containing a laminated piezoelectric element 8 and an individual electrode 9.

In the inkjet recording head shown in FIG. 1, on a substrate 1, a plurality of dot formation parts each containing a pressure chamber 2 and a nozzle 3 communicating with the pressure chamber 2 are arranged.

Figure 2A:
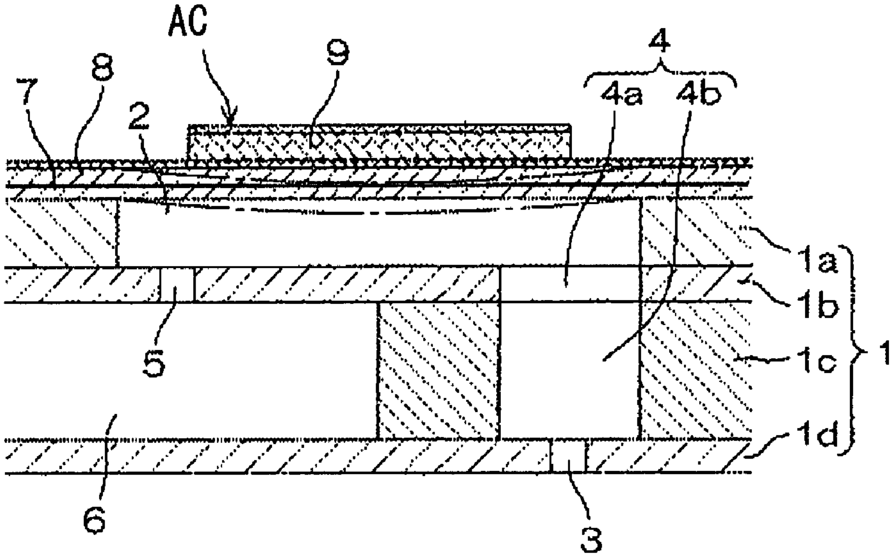
FIG. 2(*a*) is a partial enlarged lateral section view of a piezoelectric inkjet recording head shown in FIG. 1, and FIG. 2(*b*) is a bottom view of the same.
Figure 2B:
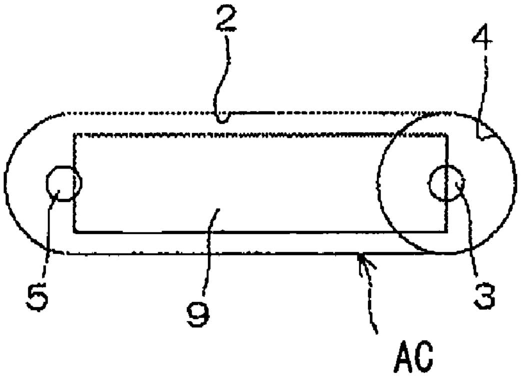
Figure 3:
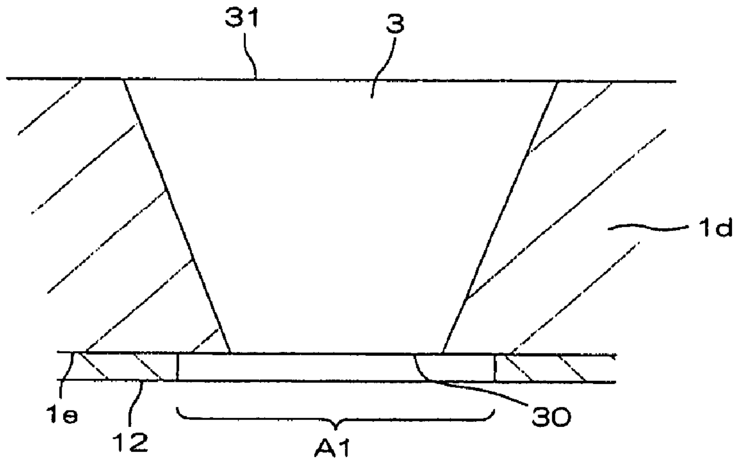
FIG. 3 is an enlarged view of a nozzle part in FIG. 2(*a*)

FIG. 2(*a*) is an enlarged section view showing one dot formation part in the piezoelectric inkjet recording head in the state that a piezoelectric actuator is attached, and FIG. 2(*b*) is a perspective view showing the stacked state of each part constituting the formation part of one dot. FIG. 3 is an enlarged view of the nozzle 3 and its vicinity in FIG. 2(*a*).

The nozzles 3 of dot formation part are arranged in plural lines in the main scanning direction (conveying direction of recording medium) shown by the arrow in FIG. 1. In FIG. 1, the arrangement includes four lines, and the pitch between dot formation parts in the same line is, for example, 150 dpi, so that 600 dpi is realized by the entire piezoelectric inkjet recording head.

Each dot formation part is so configured that, the pressure chamber 2 formed on the top face of the substrate 1 and the nozzle 3 of a truncated cone shape formed on the bottom face of the substrate are communicated via a nozzle flow channel 4, while the pressure chamber 2 is connected to a common flow channel 6 (shown by broken lines in FIG. 1) via a supply port 5. The pressure chamber 2 has a planner shape in which its center is situated in the center part in the width direction of a rectangular part, and has end parts each having diameter equal to the length of width and a semicircular horizontal section shape, at both ends in the longitudinal direction of the rectangular part. The nozzle 3 is formed into a truncated cone which is concentric with a semicircle of the end part at either one end of the pressure chamber 2. The nozzle flow channel 4 is formed into a circular column having the same center and diameter with the semicircle of the end part. The supply port 5 is formed into a circular column which is concentric with a semicircle of the end part at the other end of the pressure chamber 2. The common flow channel 6 is formed in the substrate 1 so that it communicates with each dot formation part.

Each part as described above is formed by laminating and integrating a first substrate 1*a* in which the pressure chamber 2 is formed, a second substrate 1*b* in which an upper part 4*a* of the ink flow channel 4 and the ink supply port 5 are formed, a third substrate 1*c* in which a lower part 4*b* of the ink flow channel 4 and the common flow channel 6 are formed, and a fourth substrate 1*d* in which the nozzle 3 is formed as a nozzle plate, in this order.

As shown in FIG. 3, in the nozzle 3, an opening 30 at the distal end of the ink droplet discharge side is formed into a circular shape on a bottom surface 1*e* of the fourth substrate 1*d* which is the bottom face side of the substrate 1. Also in the nozzle 3, the opening 30 on its distal end side is tapered (conical) so that it is smaller than an opening 31 on the side of the pressure chamber 2.

As shown in FIG. 1, the first substrate 1*a* and the second substrate 1*b* are formed with a through-hole 11*a* for constituting a joint part 11 for connecting the common flow channel 6 formed in the third substrate 1*c* to the piping from an ink cartridge (not shown) on the top face side of the substrate 1. Further, each substrate 1*a* to 1*d* is made of, for example, resin or metal, and is formed into a plate member which is to become each part as described above, having a specific thickness and formed with a through-hole by etching utilizing photolithography.

On the top face side of the substrate 1, a piezoelectric actuator AC is formed by stacking the laminated piezoelectric element 8 and the individual electrode 9 in this order. The piezoelectric element 8 is formed of thick plate shape having planner shape and operating in lateral vibration mode, which is substantially in the same size with the substrate 1 and has a common electrode 7 therein. This piezoelectric element 8 is formed by laminating a piezoelectric member, common electrode 7 and piezoelectric member in this order. Each individual electrode 9 having substantially rectangular same planner shape is provided individually in the position overlapping a center part of the pressure chamber 2 in each dot formation part as shown by dashed-dotted lines in FIG. 1.

Both the common electrode 7 and the individual electrode 9 are formed from metal foil having excellent electric conductivity such as gold, silver, platinum, copper or aluminum, or from a plating film or vapor-deposited film of such metal.

As the piezoelectric material forming the piezoelectric element 8 (piezoelectric body), for example, lead zirconate titanate (PZT), PZT to which one or two or more kinds of oxides such as lanthanum, barium, niobium, zinc, nickel, manganese is added, for example, PZT-based piezoelectric materials such as PLZT can be exemplified. Moreover, those based on lead magnesium niobate (PMN), lead nickel niobate (PNN), lead zinc niobate, lead manganese niobate, lead antimony stannate, lead titanate, barium titanate and the like can be exemplified.

The piezoelectric element 8 may be formed, for example, by adhesively securing a chip having a specific planner shape obtained by polishing a sintered body formed by sintering of the piezoelectric material into a thin plate, in a predetermined position, or by printing a specific planner shape with a paste prepared from metal oxide compound which are materials for piezoelectric material by a sol-gel method (or MOD method), followed by drying, pre burning and burning steps, or by forming a thin film of piezoelectric material into a planner shape by gas-phase growing methods such as reactive sputtering, reactive vacuum deposition, or reactive ion plating.

Centerline average roughness of piezoelectric element 8 can has desired centerline average roughness by particle growth promotion in burning condition or by being subjected to surface treatment using mechanical polishing or etching. Centerline average roughness of the piezoelectric element 8 may be measured using, for example, an optical interferotype centerline average roughness meter (Wyko NT1100 available from Veeco), and evaluated as average centerline average roughness Ra.

In order to drive the piezoelectric element 8, for example, in a lateral vibration mode, polarization of the piezoelectric material is made to be oriented in the direction of thickness of the piezoelectric element 8, more specifically, in the direction directing from the individual electrode 9 to the common electrode 7. To achieve this, conventionally known polarizing method such as high-temperature polarizing method, room temperature polarizing method, alternating electric field superimposing method, and electric field cooling method may be used. Further, the piezoelectric element 8 after polarization may be subjected to aging process.

The piezoelectric element 8 in which polarizing direction of the piezoelectric material is oriented to the above direction will shrink in the plane crossing at right angles with the polarization direction upon application of a positive driving voltage from the individual electrode 9 while the common electrode 7 is grounded. Therefore, the force when deflection occurs is transferred to the ink in the pressure chamber 2 as a pressure wave, and this pressure wave causes oscillation of ink in the supply port 5, the pressure chamber 2, the nozzle flow channel 4, and the nozzle 3. Then the velocity of the oscillation eventually goes outside the nozzle 3, so that the ink meniscus in the nozzle 3 is pushed externally through the distal end opening 30 of the ink droplet discharge side, and an ink column is formed. Thereafter, velocity of oscillation goes inside the nozzle, while the ink column continues moving in the external direction of the nozzle, with the result that one or two droplets of ink separated from the ink meniscus flies in the direction of sheet face, and forms a dot on the sheet.

The amount of ink consumed by flying of ink droplets is recharged into the nozzle 3 by surface tension of the ink meniscus in the nozzle 3, from the ink cartridge, via the piping of the ink cartridge, the joint part 11, the common flow channel 6, the supply port 5, the pressure chamber 2, and the ink flow channel 4.

On a surface 1*e* of the fourth substrate 1*d* which is the bottom face side of the substrate 1, a planar area A1 which is not subjected to water-repellent finish, and the circular opening 30 of the distal end of the nozzle 3 are provided in overlapping manner. That is, a water repellent layer 12 is overlaid on the surface 1*e* excluding the area A1 to provide water-repellent finish, while in the area A1, water-repellent finish is not made and the surface of the fourth substrate 1*d* is exposed so as to achieve the condition in which no water repellent layer 12 is formed.

Film thickness of the water repellent layer 12 is preferably, but is not particularly limited to, 0.5 to 2 μm. When the film thickness of the water repellent layer 12 is less than this range, water repellency decreases, and defect in discharge of ink droplet may occur due to adhesion of ink. The water repellent layer 12 having a film thickness of larger than 2 μm is difficult to be formed, and even if such layer is provided, no more effect may be obtained.

As a driving means of piezoelectric inkjet head used in the present invention, any of a pull-push system and a push-push system may be used. In the pull-push system, the piezoelectric element 8 is caused to deform in the direction in which the volume of the pressure chamber 2 increases, to draw-in the ink meniscus in the nozzle, and then the piezoelectric element 8 is caused to deform in the direction in which the volume of the pressure chamber 2 decreases, thereby making an ink droplet separate from the ink meniscus and discharging the same. In the push-push system, the piezoelectric element 8 is caused to deform in the direction in which the volume of pressure chamber 2 decreases, to push out the ink meniscus in the nozzle 3, and then the piezoelectric element 8 is caused to deform in the direction in which the volume of pressure chamber 2 increases to draw in the ink meniscus, thereby making an ink droplet separate from the ink meniscus and discharging the same.

For achieving high-speed printing, in the recording apparatus of the present invention, the recording head has 500 or more nozzles, preferably 1000 to 3000 nozzles, and is driven at frequency of 15 kHz or higher, and the recording head may be used while two or more, preferably two to eight, more preferably two to four recording heads are connected in the horizontal direction which is perpendicular to the convey direction of the recording medium. By connecting plural recording heads so that they span the width of the recording medium or longer, they can be used as a line head.

In initial charging of ink into the inkjet recording head, as shown in FIG. 1, ink is supplied to the recording head via the joint part 11 while a pump (not illustrated) is placed between piping from the ink cartridge (not illustrated) and the joint part 11 for connecting the piping. As the pump, a tube pump, a gear pump, an electromagnetic pump and the like may be used according to the purpose.

In the case of color printing, ink forms a multicolor set in combination with the recording head, and usually forms an ink set including yellow, magenta, cyan and black. And it is preferred to form a recording apparatus combining the ink and recording head of the present invention using such a set.

Second Embodiment

In the inkjet recording head used in the present embodiment, a part of wall face of the pressure chamber in which a nozzle is provided is formed of a piezoelectric element, and the piezoelectric element is activated and deformed to make pressure wave act on the ink in the pressure chamber, thereby discharging an ink droplet from the nozzle. Average inclination Δa of the piezoelectric element is 100 to 1000 mrad, and contact angle with ink is 45 degrees or smaller, and further, the above expression (2) is satisfied. Preferably, the contact angle is from 5 to 45 degrees.

According to the present invention, it was revealed that ink chargeability for the inkjet recording head has a relation to average inclination of surface of the piezoelectric element that directly contacts the ink to cause generation of pressure wave. That is, when average inclination Δa of the piezoelectric element exceeds 1000 mrad, the time required for the ink to achieve a desired charging ratio is extended. This is attributable to the fact that a longer time is required for the ink to enter fine deep structure in the surface of the piezoelectric element when the average inclination is large. Within the range of the present invention, the time required for achieving a desired charging ratio is reduced. Here, the term charging ratio means ratio of nozzle number in which printing is succeeded, relative to the total nozzle number possessed by the inkjet recording head.

Figure 5:
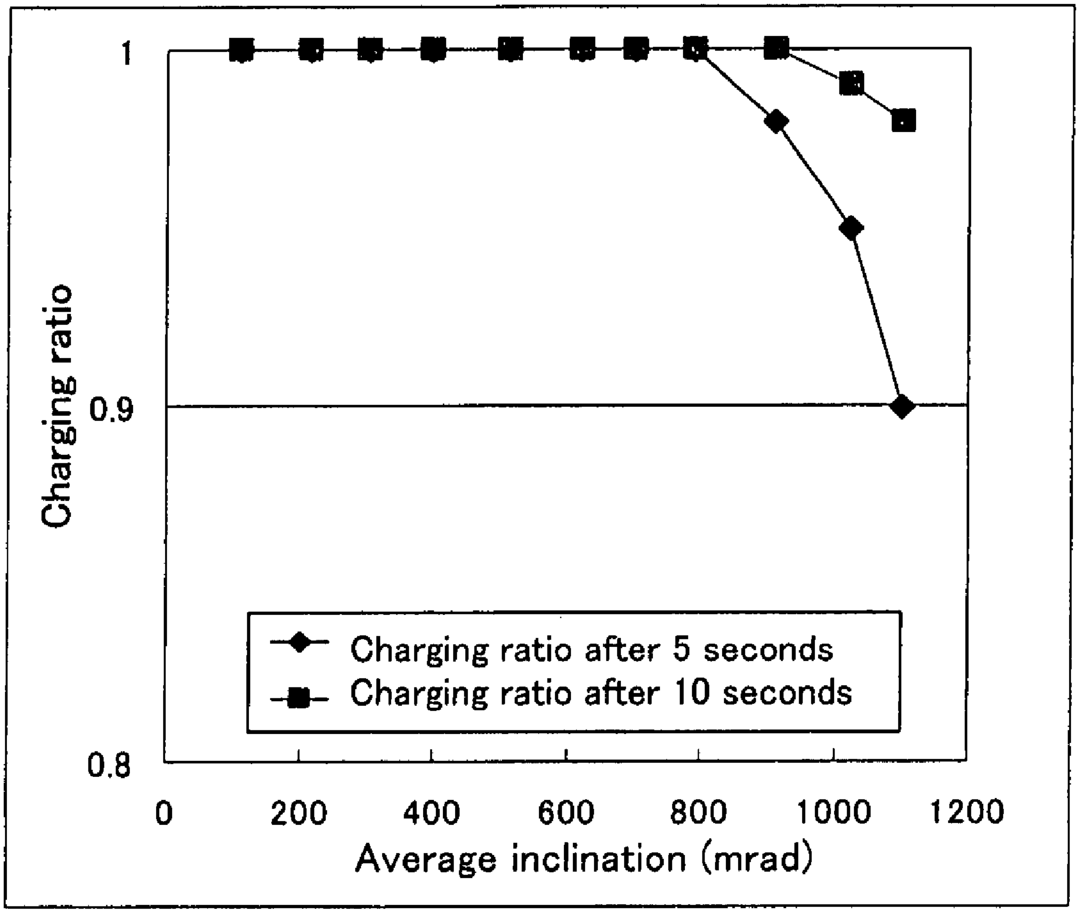
FIG. 5 is a graph showing the relationship between average inclination of piezoelectric element and charging ratio of ink.

Here, using FIG. 5, relationship between average inclination Δa of surface of piezoelectric element and charging ratio will be explained in more detail. In FIG. 5, the horizontal axis represents average inclination Δa (mrad) of surface of piezoelectric element, and the vertical axis represents charging ratio, and charging ratios after 5 seconds and 10 seconds after charging of the ink are shown. Contact angle of ink is 45 degrees. As can be seen from FIG. 5, when the average inclination is larger than a certain value, charging ratio of ink decreases, and in particular, charging ratio after 5 seconds decreases. Therefore, in order to charge ink more rapidly, it is necessary that average inclination Δa of piezoelectric element is 1000 mrad or less. Since productivity of the piezoelectric element drops at average inclination Δa of piezoelectric element of less than 100 mrad, average inclination Δa of piezoelectric element should be 100 mrad to 1000 mrad, and preferably 100 mrad to 800 mrad.

Furthermore, it was revealed that ink chargeability has relationship with contact angle between piezoelectric element and ink. That is, when the contact angle exceeds 45 degrees, the time required for the ink to achieve a desired charging ratio is longer. Contrarily, when the contact angle is 45 degrees or less, the time required for the charging ratio to raise is reduced as the contact angle is smaller. However, when the contact angle is very small, wettability to the nozzle surface is high, so that charging ratio may decrease. Therefore, the contact angle is preferably 5 to 45 degrees.

Figure 6:
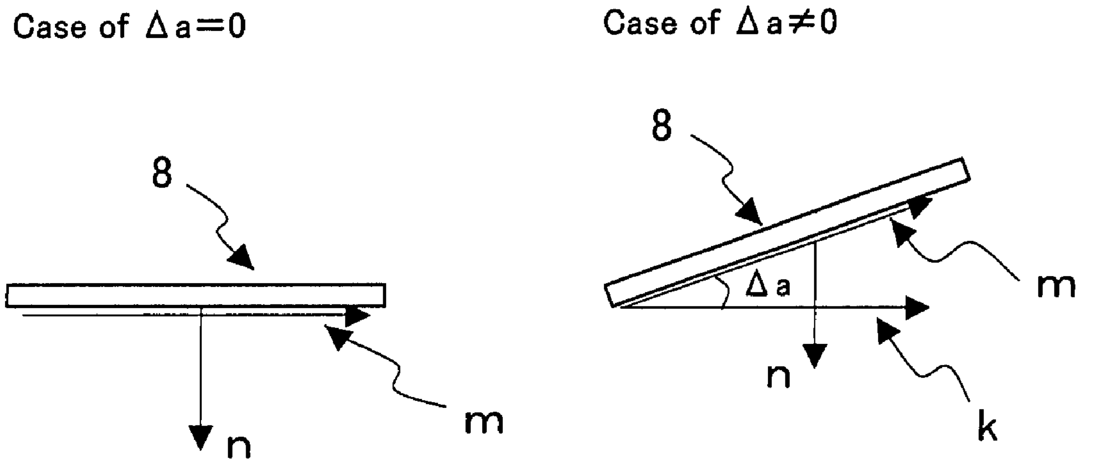
FIG. 6 is a schematic view showing the relationship between average surface inclination $\Delta a$ and each directional component of wetting speed of ink.

As for ink chargeability, charging ratio rapidly increases when average inclination Δa of the piezoelectric element and the contact angle θ satisfy the above expression (1). Outside the range of the above expression (1), a time is required for improving the charging ratio. This is because cos θ has a relation to wetting speed in which ink makes surface of piezoelectric element get wet, and by multiplying this by cos (Δa), velocity component k in the average surface direction of piezoelectric element of the velocity is taken out as shown in FIG. 6. Therefore, the above expression (1) is referable to as an experimental expression concerning the speed at which surface of piezoelectric element is charged with ink. In FIG. 6, m represents the aforementioned wetting velocity, n represents a normal direction with respect to the average surface of piezoelectric element, and 8 represents a piezoelectric element.

Average inclination of piezoelectric element 8 can has desired average inclination by particle growth promotion in burning condition or by being subjected to surface treatment using mechanical polishing or etching. Average inclination of the piezoelectric element 8 may be measured using, for example, an optical interferotype surface roughness meter (Wyko NT1100 available from Veeco).

Other configuration is as same as that of the previous embodiment, and hence detailed description thereof will be omitted.

For achieving high-speed printing, in the recording apparatus of the present invention, the recording head has 500 or more nozzles, width is 1 centimeter or larger, and two or more, preferably two to eight, more preferably two to four recording heads are connected in the horizontal direction which is perpendicular to the convey direction of the recording medium. Preferably, it is used as a line head by connecting plural inkjet recording heads so that they span the width of the recording medium or longer. Convey speed of the recording medium is preferably 60 to 100 mm/s.

Examples and Comparative Examples of the present invention will now be described. It is understood, however, that the examples are for the purpose of illustration and the invention is not to be regarded as limited to any of the specific materials or condition therein.

EXAMPLES

Examples 1 to 16 and Comparative examples 1 to 8

(Preparation of Ink)

Inks of the present invention were prepared according to the formulations for inks No. 1 to No. 10 shown in Table 1. Each material shown Table 1 was put into a beaker so that the total amount was 500 g, and stirred for 30 minutes at 800 rpm by a stirrer, and filtrated through a membrane filter of 10 μm. As a surfactant, Olfin E1010 [EO (ethylene oxide) addition compound of acetylenediol, available from Nissin Chemical Industry Co., Ltd.] was used.

TABLE 1

| | Ink No. (parts by weight) | | | | | | | | | |
|---|---|---|---|---|---|---|---|---|---|---|
| | 1 | 2 | 3 | 4 | 5 | 6 | 7 | 8 | 9 | 10 |
| C.I. Food black 2 | 3 | 3 | 3 | 3 | 3 | 3 | 3 | 3 | 3 | 3 |
| Glycerol | 10 | 10 | 10 | 10 | 10 | 10 | 10 | 10 | 10 | 10 |
| Olfin E1010 | | 0.09 | 1 | | 0.08 | 0.07 | | | | |
| Ethanol | 5 | | | | | | 7 | 10 | 12 | 15 |
| Water | Residue | Residue | Residue | Residue | Residue | Residue | Residue | Residue | Residue | Residue |

(Preparation of Inkjet Recording Head)

An inkjet recording head in which 166 dot formation parts per one line, and the total (four lines) of 664 dot formation parts are arranged on the substrate 1 was used. Each of these dot formation parts has the structure shown in FIG. 1 and FIGS. 2(*a*), (*b*) and consists of the pressure chamber 2 having area of 0.2 $mm^2$ and measuring 2200 μm in width and 100 μm in depth, the nozzle flow channel 4 measuring 200 μm in diameter and 800 μm in length, the supply port 5 measuring 30 μm in diameter and 40 μm in length, the nozzle 3 measuring 30 μm in length, and the opening 30 on the ink discharge side and the opening 31 on the side of pressure chamber 2 in the shapes of circles of 10 μm and 20 μm in diameter, respectively.

The pitch between adjacent dot formation parts in the same line was 150 dpi, and the total of 600 dpi was established by shifting the neighboring lines by ½ pitch.

Centerline average roughness of used piezoelectric element and contact angle between this and the ink were as shown in Table 2.

(Evaluation Method)

Using a recording apparatus mounting the ink and the inkjet recording head obtained in the above, ink droplets were discharged continuously, and discharge condition was observed. In brief, either one of the inks No. 1 to No. 10 shown in Table 1 was charged from an ink tank into an inkjet recording head incorporating a piezoelectric element having either one centerline average roughness Ra shown in Table 2 under pressure of 200 kPa using a gear pump, and then discharged continuously at a driving voltage of 20V, and a driving frequency of 15 kHz, and charging ratio after 10 seconds was evaluated.

TABLE 2

| | Ink No. | Centerline average roughness (μm) | Contact angle (Degree) | Value of A $\cos^2\theta$ | Charging ratio (—) |
|---|---|---|---|---|---|
| Example 1 | 3 | 0.056 | 30 | 0.0420 | 1.00 |
| Example 2 | 1 | 0.138 | 45 | 0.0690 | 1.00 |
| Example 3 | 2 | 0.138 | 35 | 0.0926 | 1.00 |
| Example 4 | 7 | 0.178 | 22 | 0.1530 | 1.00 |
| Example 5 | 8 | 0.178 | 14 | 0.1680 | 1.00 |
| Example 6 | 9 | 0.178 | 10 | 0.1730 | 1.00 |
| Example 7 | 10 | 0.178 | 5 | 0.1770 | 1.00 |
| Example 8 | 1 | 0.312 | 45 | 0.1560 | 1.00 |
| Example 9 | 1 | 0.506 | 45 | 0.2530 | 1.00 |
| Example 10 | 1 | 0.688 | 45 | 0.3440 | 1.00 |
| Example 11 | 1 | 1.02 | 45 | 0.5100 | 1.00 |
| Example 12 | 1 | 1.33 | 45 | 0.6650 | 1.00 |
| Example 13 | 1 | 1.51 | 45 | 0.7550 | 1.00 |
| Example 14 | 1 | 1.78 | 45 | 0.8900 | 1.00 |
| Example 15 | 1 | 2.1 | 45 | 1.0500 | 1.00 |
| Example 16 | 1 | 2.27 | 45 | 1.1350 | 1.00 |
| Comp. Ex. 1 | 2 | 0.056 | 35 | 0.0376 | 0.93 |
| Comp. Ex. 2 | 5 | 0.138 | 62 | 0.0304 | 0.88 |
| Comp. Ex. 3 | 5 | 0.178 | 62 | 0.0392 | 0.97 |
| Comp. Ex. 4 | 4 | 0.178 | 76 | 0.0104 | 0.90 |
| Comp. Ex. 5 | 1 | 0.056 | 45 | 0.0280 | 0.95 |
| Comp. Ex. 6 | 1 | 0.078 | 45 | 0.0390 | 0.98 |
| Comp. Ex. 7 | 8 | 0.045 | 14 | 0.0424 | 0.95 |
| Comp. Ex. 8 | 6 | 0.138 | 55 | 0.0454 | 0.94 |

In the present example, centerline average roughness of piezoelectric element and contact angle were measured in the following manners.

(Measurement of Contact Angle)

Contact angle of ink was measured using a contact angle meter available from Kyowa Interface Science Co., Ltd.

(Measurement of Centerline Average Roughness)

Centerline average roughness Ra of surface of piezoelectric element was measured using an optical interferotype average roughness meter (Wyko NT1100 available from Veeco) in VSI mode.

(Evaluation Result)

As shown in Table 2, when the centerline average roughness and the contact angle fall within the ranges of the present invention, but the expression (1) is outside the range of the present invention, charging ratio is low (Comparative examples 1, 5, 6). Furthermore, when the contact angle and the above expression (1) are outside the ranges of the present invention, charging ratio is low (Comparative examples 2 to 4). Moreover, when the contact angle and the expression (1) fall within the ranges of the present invention, but the centerline average roughness is outside the range of the resent invention (Comparative example 7), or alternatively, when the centerline average roughness and the expression (1) fall within the ranges of the present invention, but the contact angle is outside the range of the present invention (Comparative example 8), the charging ratio is low.

On the other hand, when the centerline average roughness, the contact angle and the expression (1) fall within the ranges of the present invention, charging ratio was 1.0 (100%).

Examples 17 to 31 and Comparative Examples 9 to 17

An inkjet recording head was obtained in the same manner as in Example 1 to 16 and Comparative examples 1 to 8 except that a piezoelectric element having average inclination and contact angle shown in Table 3 was used, and charging ratio was evaluated.

(Evaluation Method of Charging Ratio)

Either one of the inks No. 1 to No. 10 shown in Table 1 was charged into an inkjet recording head incorporating a piezoelectric element having either one average inclination Δa shown in Table 3, from an ink tank under pressure of 200 kPa using a gear pump, and after 5 seconds from charging, ink was discharged continuously at a driving voltage of 20V, and a driving frequency of 15 kHz, and charging ratio was evaluated after 5 seconds and 10 seconds. The results are shown in Table 3.

TABLE 3

| | Ink No. | Average inclination (mrad) | Contact angle (Degree) | Value of Expression (2) | Charging ratio (—) After 5 seconds | After 10 seconds |
|---|---|---|---|---|---|---|
| Example 17 | 3 | 922 | 30 | 0.523 | 1.00 | 1.00 |
| Example 18 | 1 | 383 | 45 | 0.656 | 1.00 | 1.00 |
| Example 19 | 2 | 383 | 35 | 0.760 | 1.00 | 1.00 |
| Example 20 | 3 | 354 | 30 | 0.812 | 1.00 | 1.00 |
| Example 21 | 1 | 354 | 45 | 0.663 | 1.00 | 1.00 |
| Example 22 | 7 | 354 | 22 | 0.870 | 1.00 | 1.00 |
| Example 23 | 8 | 354 | 14 | 0.910 | 1.00 | 1.00 |
| Example 24 | 9 | 354 | 10 | 0.924 | 1.00 | 1.00 |
| Example 25 | 10 | 354 | 5 | 0.934 | 1.00 | 1.00 |
| Example 26 | 1 | 111 | 45 | 0.703 | 1.00 | 1.00 |
| Example 27 | 1 | 215 | 45 | 0.691 | 1.00 | 1.00 |
| Example 28 | 1 | 514 | 45 | 0.616 | 1.00 | 1.00 |
| Example 29 | 1 | 620 | 45 | 0.575 | 1.00 | 1.00 |
| Example 30 | 1 | 700 | 45 | 0.541 | 1.00 | 1.00 |
| Example 31 | 1 | 782 | 45 | 0.502 | 1.00 | 1.00 |
| Comp. Ex. 9 | 2 | 922 | 35 | 0.495 | 0.94 | 0.98 |
| Comp. Ex. 10 | 5 | 383 | 62 | 0.435 | 0.88 | 0.95 |
| Comp. Ex. 11 | 5 | 354 | 62 | 0.440 | 0.93 | 0.97 |
| Comp. Ex. 12 | 4 | 354 | 76 | 0.226 | 0.80 | 0.90 |
| Comp. Ex. 13 | 1 | 911 | 45 | 0.433 | 0.98 | 1.00 |
| Comp. Ex. 14 | 1 | 1024 | 45 | 0.368 | 0.95 | 0.99 |
| Comp. Ex. 15 | 1 | 1103 | 45 | 0.319 | 0.90 | 0.98 |

TABLE 3-continued

| | Ink No. | Average inclination (mrad) | Contact angle (Degree) | Value of Expression (2) | Charging ratio (—) After 5 seconds | Charging ratio (—) After 10 seconds |
|---|---|---|---|---|---|---|
| Comp. Ex. 16 | 8 | 1024 | 14 | 0.505 | 0.95 | 0.96 |
| Comp. Ex. 17 | 6 | 111 | 55 | 0.570 | 0.92 | 0.93 |

Contact angle of piezoelectric element was measured in the same manner as described above. Average inclination was measured in the following manner.

(Measurement of Average Inclination)

Average inclination Δa of surface of piezoelectric element was measured by using an optical interferotype average roughness meter (Wyko NT1100 available from Veeco) in VSI mode.

(Evaluation Result)

As shown in Table 3, when average inclination and contact angle fall within the ranges of the present invention, but the value of the above expression (2) is outside the range of the present invention, charging ratios after 5 seconds and 10 seconds are low (Comparative examples 9, 13). Furthermore, when contact angle and value of the above expression (2) are outside the ranges of the present invention, charging ratios after 5 seconds and 10 seconds are low (Comparative examples 10 to 12). Moreover, when average inclination and value of the above expression (2) are outside the ranges of the present invention, charging ratios after 5 seconds and 10 seconds are low (Comparative examples 14, 15). Even when value of the above expression (2) falls within the range of the present invention, charging ratios after 5 seconds and 10 seconds are low when average inclination is outside the range of the present invention (Comparative example 16), and when the contact angle is outside the range of the present invention (Comparative example 17).

In contrast to this, when average inclination, contact angle and value of the above expression (2) fall within the ranges of the present invention,; charging ratios exhibited after 5 seconds and 10 seconds were 1.0 (100%).

What is claimed is:

1. An inkjet recording system comprising an inkjet recording head in which a part of wall face of a pressure chamber in which a nozzle is provided is formed of a piezoelectric element, and said piezoelectric element is activated and deformed to make pressure wave act on ink in said pressure chamber, thereby discharging an ink droplet from said nozzle, wherein a surface of the piezoelectric element forming said part of wall face of the pressure chamber has a centerline average roughness Ra ranging from 0.05 to 2 μm, and a contact angle θ with ink is 45 degrees or less, and the following expression (1) is satisfied;

$$A\cos^2\theta > 0.04 \quad (1)$$

wherein A represents centerline average roughness Ra (μm) of surface of piezoelectric element forming wall surface of the pressure chamber, and θ represents contact angle of ink with respect to piezoelectric element.

2. The inkjet recording system according to claim 1, wherein said inkjet recording head is formed of a plurality of dot formation parts, each dot formation part having said pressure chamber and said nozzle communicating thereto, said pressure chamber being formed of a substrate and a piezoelectric element having a common electrode formed therein, and an individual electrode is disposed on a face opposite side to said pressure chamber of said piezoelectric element for applying a driving voltage to said piezoelectric element.

3. The inkjet recording system according to claim 1, wherein said contact angle is from 5 to 45 degrees.

4. The inkjet recording system according to claim 1, wherein said ink comprises at least water, a coloring agent, a water-soluble organic solvent and a surfactant.

5. The inkjet recording system according to claim 4, wherein said coloring agent comprises a pigment.

6. An inkjet recording system comprising an inkjet recording head in which a part of wall face of a pressure chamber in which a nozzle is provided is formed of a piezoelectric element, and said piezoelectric element is activated and deformed to make pressure wave act on ink in said pressure chamber, thereby discharging an ink droplet from said nozzle, wherein a surface of the piezoelectric element forming said part of wall face of the pressure chamber has an average inclination Δa of 100 to 1000 mrad, and contact angle θ with ink is 45 degrees or less, and the following expression (2) is satisfied;

$$\cos\theta \times \cos(\Delta a) > 0.5 \quad (2)$$

wherein Δa represents average inclination (rad) of surface of piezoelectric element forming wall face of pressure chamber, and θ represents contact angle of ink with respect to piezoelectric element.

7. The inkjet recording system according to claim 6, wherein said inkjet recording head is formed of a plurality of dot formation parts, each dot formation part having said pressure chamber and said nozzle communicating thereto, said pressure chamber being formed of a substrate, and a piezoelectric element having a common electrode formed therein, and an individual electrode is disposed on a face opposite side to said pressure chamber of said piezoelectric element for applying a driving voltage to said piezoelectric element.

8. The inkjet recording system according to claim 6, wherein said contact angle is from 5 to 45 degrees.

9. The inkjet recording system according to claim 6, wherein said ink comprises at least water, a coloring agent, a water-soluble organic solvent and a surfactant.

10. The inkjet recording system according to claim 9, wherein said coloring agent comprises a pigment.

* * * * *